United States Patent
Colvin et al.

(10) Patent No.: US 9,006,690 B2
(45) Date of Patent: Apr. 14, 2015

(54) EXTRACTION ELECTRODE ASSEMBLY VOLTAGE MODULATION IN AN ION IMPLANTATION SYSTEM

(71) Applicants: Neil K. Colvin, Merrimac, NH (US); Jincheng Zhang, Hanover, NH (US)

(72) Inventors: Neil K. Colvin, Merrimac, NH (US); Jincheng Zhang, Hanover, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/886,963

(22) Filed: May 3, 2013

(65) Prior Publication Data
US 2014/0326901 A1    Nov. 6, 2014

(51) Int. Cl.
*H01J 37/317* (2006.01)
*H01J 37/08* (2006.01)

(52) U.S. Cl.
CPC ............. *H01J 37/3171* (2013.01); *H01J 37/08* (2013.01); *H01J 2237/022* (2013.01); *H01J 2237/304* (2013.01)

(58) Field of Classification Search
CPC ............. H01J 37/08; H01J 2237/022; H01J 2237/31701; H01J 27/024; H01J 37/3171; H01J 2209/017; H01J 37/32862
USPC ............. 250/492.21, 423 R, 396 R, 426, 424; 315/111.81, 111.31; 134/1.1; 427/523
See application file for complete search history.

(56) References Cited

U.S. PATENT DOCUMENTS

| | | | | |
|---|---|---|---|---|
| 5,497,006 A * | 3/1996 | Sferlazzo et al. | ............. | 250/427 |
| 5,661,308 A * | 8/1997 | Benveniste et al. | ...... | 250/492.21 |
| 6,452,338 B1 * | 9/2002 | Horsky | .................. | 315/111.81 |
| 6,501,078 B1 * | 12/2002 | Ryding et al. | ............ | 250/423 R |
| 7,915,597 B2 * | 3/2011 | Huang et al. | ............. | 250/396 R |
| 2009/0095713 A1 * | 4/2009 | Dimeo et al. | ................... | 216/58 |
| 2009/0236547 A1 * | 9/2009 | Huang et al. | ............ | 250/492.21 |
| 2011/0240889 A1 * | 10/2011 | Colvin et al. | ........... | 250/492.21 |
| 2014/0041684 A1 * | 2/2014 | Kurunczi et al. | ............ | 134/1.1 |
| 2014/0127394 A1 * | 5/2014 | Gammel et al. | ................. | 427/8 |

* cited by examiner

*Primary Examiner* — Michael Logie

(57) ABSTRACT

A method is disclosed for reducing particle contamination in an ion implantation system, wherein an ion beam is created via the ion source operating in conjunction with an extraction electrode assembly. A cathode voltage is applied to the ion source for generating ions therein, and a suppression voltage is applied to the extraction assembly for preventing electrons in the ion beam from being drawn into the ion source. The suppression voltage is selectively modulated, thereby inducing a current flow or an arc discharge through the extraction assembly to remove deposits on surfaces thereof to mitigate subsequent contamination of workpieces. An improvement to an ion implantation system is also disclosed in accordance with the foregoing, wherein a controller is configured to selectively modulate a voltage between a predetermined voltage and a predetermined suppression voltage generally concurrent with the transferring of the workpiece, thereby inducing a current flow or an arc discharge through the extraction electrode assembly to remove deposits on surfaces thereof to mitigate subsequent contamination of workpieces.

5 Claims, 6 Drawing Sheets

EXTRACTION ELECTRODE ASSEMBLY VOLTAGE MODULATION IN AN ION IMPLANTATION SYSTEM

FIELD OF THE INVENTION

The present invention relates to an improvement in operation for an ion implantation system, and more particularly to a system for electrode voltage modulation in an ion source extraction suppression electrode configuration for creating a discharge during non-implant periods to remove deposits in the vicinity f the electrodes and thereby mitigate contamination along the ion beamline.

BACKGROUND OF THE INVENTION

Ion implanters are used to treat silicon wafers by bombardment of the wafers with an ion beam. One use of such beam treatment is to selectively implant the wafers with impurities of a specified dopant material, at a predetermined energy level, and in controlled concentration, to produce a semiconductor material during fabrication of a integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Batch-type ion implanters are well known, which typically include a spinning disk support for moving multiple silicon wafers through the ion beam. The ion beam impacts the wafer surface as the support rotates the wafers through the ion beam. Serial-type ion implanters are also known, which treat one wafer at a time. The wafers are supported in a cassette and are withdrawn one at time and placed onto a wafer support. The wafer is then oriented in an implantation orientation so that the ion beam strikes the single wafer. These serial implanters use beam shaping electronics to deflect the beam from its initial trajectory and often are used in conjunction with co-ordinated wafer support movements to selectively dope or treat the entire wafer surface. As wafers are processes through an ion implantation system they are transferred between specialized processing chambers and wafer input/output stations. Robots are routinely used to transfer wafers in to and out of the processing chamber.

Ion sources that generate the ion beams used in existing implanters are typically referred to as arc ion sources and can include heated filament cathodes for creating ions that are shaped into an appropriate ion beam for wafer treatment, U.S. Pat. No. 5,497,006 to Sferlazzo et al concerns an ion source having a cathode supported by a base and positioned with respect to a gas confinement chamber for ejecting ionizing electrons into the gas confinement chamber. The cathode of the '006 patent is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Extraction electrodes, as disclosed, for example, in U.S. Pat. No. 6,501,078 are generally used in conjunction with an ion source to extract a beam of ions therefrom, wherein ions formed in the confinement chamber are extracted through an exit aperture in a front face of the ion source. The front face of the ion source forms a first apertured source electrode at the potential of the ion source. The extraction electrodes typically include an apertured suppression electrode and an apertured ground electrode aligned with the first apertured source electrode (sometimes referred to as an extraction electrode) to allow the ion beam emerging from the ion source to pass therethough. Preferably, each aperture has an elongated slot configuration. Ceramic insulators are typically mounted between the suppression ad ground electrodes for electrically isolating the two electrodes. The ground electrode restricts the propogation of electric fields between the ground electrode and the ion source into the region downstream of the ground electrode. The suppression electrode is biased by a voltage supply to a negative potential relative to ground, and operates to prevent electrons in the ion beam downstream of the ground electrode from being drawn into the extraction region and into the ion source. Typically, the suppression and ground electrodes are mounted so as to be movable relatively to the source in the direction of travel of the ion beam so that the extraction electrodes can be "tuned" in accordance with the energy of the beam extracted from the ion source. The electrodes are further mounted, such that the suppression and ground electrodes are relatively laterally movable approximately perpendicular to the ion beam direction, relative to the source 20. In addition, a mechanism may also be provided for varying the size of the aperture in the electrodes.

The energy of the ion beam 30 emerging from the extraction assembly is determined by the voltage supplied to the ion source. A typical value for this voltage is 20 kV, providing extracted beam energy of 20 keV. However, extracted beam energies of 80 keV and higher, or 0.5 keV or lower may also be obtained. To obtain higher or lower beam energies, it is a matter of raising or lowering respectively the source voltage.

It has been found that the voltage biases associated with the ion source and extraction electrode system of a typical ion implantation system, in combination with the ionized source gas present in that environment leads to the formation of deposits on the suppression and ground electrodes, as well as the insulators situated therebetween. These deposits can deleteriously effect the operation of the ion implantation system, by causing decomposition of the insulators, deposits and coating of the insulators and in particular, uncontrollable release and discharge of these deposits and insulators, which create contaminating particles that are transported with the ion beam to other portions of the ion implantation system and ultimately to the workpiece being implanted.

It is an object of the present invention to provide a system for electrode Voltage modulation in an ion source extraction electrode apparatus for creating a controlled discharge therein to remove deposits in the vicinity of the electrodes and thereby mitigate contamination along the ion beamline and on the wafer in the ion implantation system. In some ways, the present invention builds on the concepts taught and disclosed in commonly assigned US Patent Application Publication No. 2011/0240889, wherein a method is provided for reducing particle contamination in an ion implantation system. In that invention, an ion implantation system a deceleration suppression plate well downstream from the ion source and ion source environment, and closely adjacent to the wafer processing end station is provided, wherein a deceleration (decel) suppression voltage applied to the decel suppression plate is modulated for causing the ion beam to expand and contract such that one or more beam line components are impacted by the ion beam to mitigate subsequent contamination of workpieces by previously deposited material residing on the surfaces of the one or more beam line components. That patent application teaches that contamination can be mitigated through voltage modulation to cause controlled beam fluctuation whereby beak strike removes previously deposited material or strongly adhering the previously deposited material to the one or more surfaces. By contrast, the present invention provides electrode voltage modulation for creating a controlled discharge between electrodes to remove deposits in the vicinity of the electrodes, thereby mitigating contamination along the ion beamline and on the wafer in the ion implantation system.

SUMMARY OF THE INVENTION

The following presents a simplified summary of the present invention in order to provide a basic understanding of one or more aspects thereof. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In accordance with one aspect of the invention, a method is provided for reducing particle contamination in an ion implantation system, the method comprising the steps of: providing an ion implantation system comprising: an ion source; an extraction electrode assembly situated proximate to the ion source; and an end station configured to transfer workpieces into and out of the end station for selective implantation of ions into the workpieces. An ion beam is created via the ion source operating in conjunction with the extraction assembly, whereby a cathode voltage is applied to the ion source for generating ions therein, and a suppression voltage is applied to the extraction assembly for preventing electrons in the ion beam from being drawn into the ion source, and the a workpiece is transferred the between the end station and an external environment. During this the suppression voltage is modulated, thereby inducing a current flow or an arc discharge through the extraction assembly to remove deposits on surfaces thereof to mitigate subsequent contamination of workpieces.

In accordance with another aspect of the present invention, an improvement to an ion implantation system is provided for reducing particle contamination therein, the ion implantation system comprising: an ion source; an extraction electrode assembly situated proximate to the ion source for extracting ions therefrom; and an end station configured to transfer workpieces into and out of the end station for selective implantation of ions into the workpieces. The improvement comprises a controller configured to selectively modulate a voltage between a predetermined voltage and a predetermined suppression voltage generally concurrent with the transferring of the workpiece, thereby inducing a current flow or an arc discharge through the extraction electrode assembly to remove deposits on surfaces thereof to mitigate subsequent contamination of workpieces.

EXEMPLARY EMBODIMENT FOR PRACTICING THE INVENTION

Figure 1:
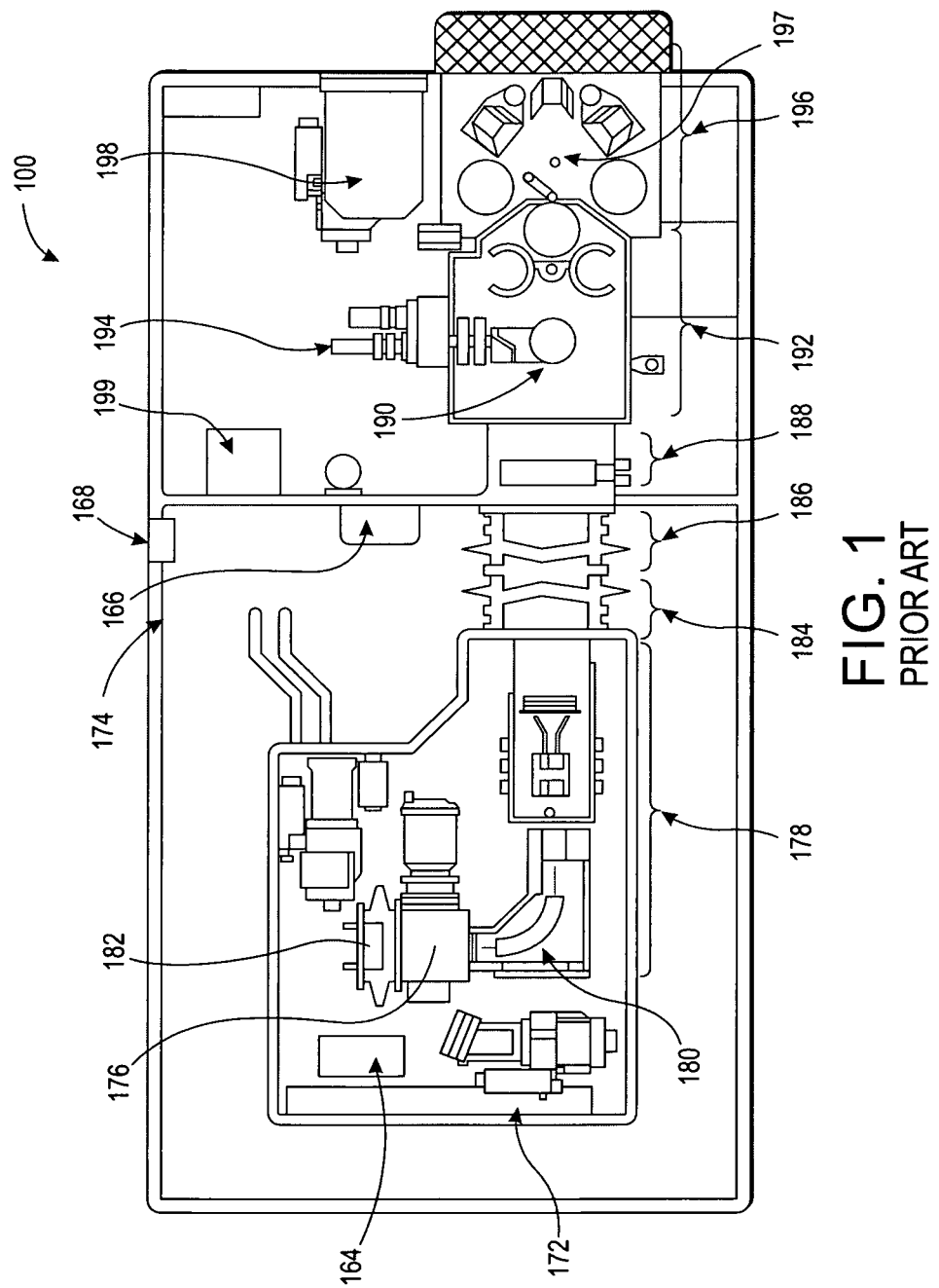
FIG. 1 illustrates a prior art system-level view of an exemplary ion implantation system.
Figure 2:
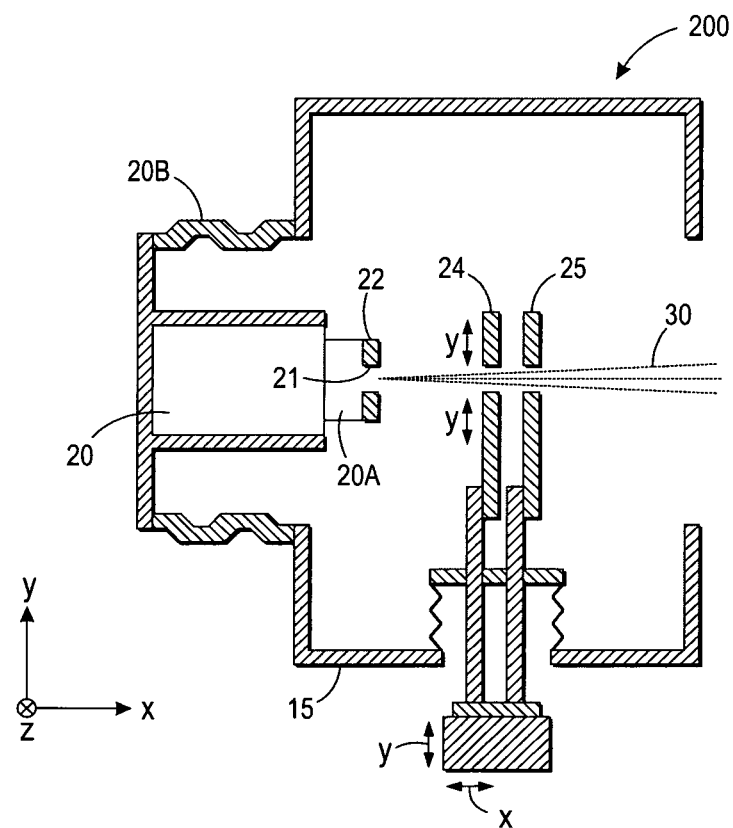
FIG. 2 is a schematic of a prior art ion source extraction apparatus and electrode assembly in accordance with an aspect of the present invention.

Referring initially to FIG. 1, a prior art ion implantation system 100 is illustrated that utilizes an extraction electrode system 200 similar to that of prior art FIG. 2, FIG. 1 illustrates a typical ion implantation system 100 that is operable to scan a workpiece 190 (e.g., a semiconductor substrate or wafer) relative to an ion beam, thereby implanting ions into the workpiece 190. FIG. 2 represents a schematic of a prior art extraction electrode system 200 that utilizes a triode type extraction electrode system 200 for extracting an ion beam 30 from an ion source 20 for implantation.

The prior art system 100 (FIG. 1) includes modular gas boxes 164 and 166, and a gas box remote purge control panel 168. The gas boxes 164 and 166 comprise, among other things, one or more gases of a dopant source material, and the boxes 164, 166 facilitate selective delivery of the gas(es) into an ion source 182 within the system 100, wherein the gas(es) can be ionized to generate ions suitable for implantation into a wafer or workpiece 190. The gas box remote control panel 168 facilitates venting or purging gas(es) or other substances out of the system 100 on an "as needed" or desired basis.

High voltage terminal power distribution 172 and a high voltage isolation transformer 174 are included to, among other things, electrically excite and impart energy to the dopant gas(es) to generate ions. An ion beam extraction assembly 176 is included to extract ions from the ion source 182 and accelerate them into a beamline region 178 illustrated by the bracket in FIG. 1, which includes a mass analysis magnet 180. The mass analysis magnet 180 is operable to sort out or reject ions of an inappropriate charge-to-mass ratio. In particular, the mass analysis magnet 180 comprises a guide having curved sidewalls into which ions of an undesired mass-to-charge ratio collide as they are propagated through the beamguide by way of one or more magnetic fields generated by magnet(s) of the mass analysis magnet 180.

A component 184 may be included to assist with controlling the angle of the ion beam. This may include, among other things, a scan angle correction lens. An acceleration/deceleration column 186 facilitates controlling and adjusting the speed, and/or focusing, of ions within the ion beam. A component 188 operable to filter out contaminant particles, such as a final energy filter may also be included to mitigate energy contaminating ions from encountering the workpiece 190.

Wafers and/or workpieces 190 are loaded into an end station chamber 192 for selective implantation of the workpieces with ions. A mechanical scan drive 194 maneuvers the workpieces 190 within the chamber 192 to facilitate selective encounters with the ion beam. The wafers or workpieces 190 are moved in to and out of the end station chamber 192 by a workpiece handling system 196, which may include, for example, one or more mechanical or robotic arms 197. In a typical implantation operation, undoped workpieces or wafers are retrieved from one of a number of cassettes by a robot outside the chamber which transfers a workpiece to a proper orientation in the implantation chamber or end station. The robotic arm of the chamber robot grasps the workpiece, brings it within the implantation chamber and places it on an electrostatic clamp or chuck support structure for supporting scanning the workpiece in front of the ion beam.

An operator console 198 allows an operator to regulate the implantation process by selectively controlling one or more components of the system 100. Finally, a power distribution box 199 is included to provide power to the overall system 100.

Referring again to prior art FIG. 2, the ion source 20 and the extraction electrodes are illustrated schematically as a cross sectional side view which utilize a triode extraction assembly, as disclosed in U.S. Pat. No. 6,501,078. The ion source 20 comprises an arc chamber 20A mounted to a housing 15. A bushing 20B acts as an insulator to isolate the ion source 20 from the remainder of the housing 15. Ions formed in the arc chamber 20A are extracted from the source 20 through an exit aperture 21 in a front face 22 of the source 20. The front face 22 of the ion source 20 forms a first apertured source electrode, which is biased at a voltage potential equal to the voltage of the ion source 20. An extraction electrode system is provided, as are illustrated in FIG. 2 by an apertured suppression electrode 24, and an apertured ground electrode 25. Each of the apertured electrodes 24, 25 comprise a single electrically conductive plate having an aperture through the plate to allow the ion beam emerging from the ion source 20 to pass therethrough. Preferably each aperture has an elongated slot configuration with the direction of elongation being perpendicular to the plane in FIG. 2. In other words the slot has its long dimension along the z axis, as shown, with the positive z axis going into the paper.

For a beam of positive ions, the ion source 20 is maintained by a voltage supply at a positive voltage relative to ground. The ground electrode 25 restricts the penetration of the electric fields between the ground electrode 25 and the ion source 20 into the region to the right (in FIG. 2) of the ground electrode 25. The suppression electrode 24 is biased by a voltage supply to a negative potential relative to ground. The negatively biased suppression electrode 24, operates to prevent electrons in the ion beam downstream of the ground electrode 25 (to the right in FIG. 2) from being drawn into the extraction region and into the ion source 20. The suppression and ground electrodes 24, 25 are mounted so as to be movable relatively to the source 20 in the direction of travel of the ion beam 30 as indicated by the arrow x. The apparatus can be "tuned" such that the gap between the extraction and suppression 24 electrodes is larger when the beam energy is larger. The electrodes are further mounted, such that the suppression 24 and ground 25 electrodes are relatively movable laterally in the direction of arrow y, namely in the plane of the paper and approximately perpendicular to the ion beam direction, relative to the source 20. A mechanism is also provided by virtue of which the size of the electrode slit can be adjusted in the lateral direction y as indicated by the y arrows in FIG. 2.

Turning to the drawings, FIG. 1 is a schematic depiction of an ion beam implanter 10. The implanter includes an ion source 12 for creating ions that form an ion beam 14, which is shaped and selectively deflected to traverse a beam path to an ending position, shown herein as implantation station 20. The implantation station includes a vacuum or implantation chamber 22 defining an interior region in which a workpiece such as a semiconductor wafer is positioned for implantation by ions that make up the ion beam 14.

As previously stated, the he extraction electrode assembly for an ion implantation system (e.g., FIG. 2) is typically comprised of the extraction electrode 22, a suppression aperture electrode 24 and a aperture ground electrode 25. The suppression electrode 24 can be biased by a voltage supply to a negative potential relative to ground. The negatively biased suppression electrode operates to prevent electrons in the ion beam downstream of the ground electrode 25 from being drawn into the extraction region and into the ion source 20.

Generally, the suppression and ground electrodes of the extraction assembly are mounted so as to be moveable in the beam direction, allowing the gap between the extraction electrode of the ion source and the suppression electrode to be adjusted to either increase or decrease this gap. The gap between the suppression and ground electrodes can be adjusted in the positive and negative y direction, as well. In this manner, the electrodes making up the extraction assembly can be "tuned" to either selectively increase or decrease a dimension of the gaps therebetween, wherein it is understood that the larger the beam energy desired, for example, the larger the gap that can to be set within the electrode assembly.

Figure 3:
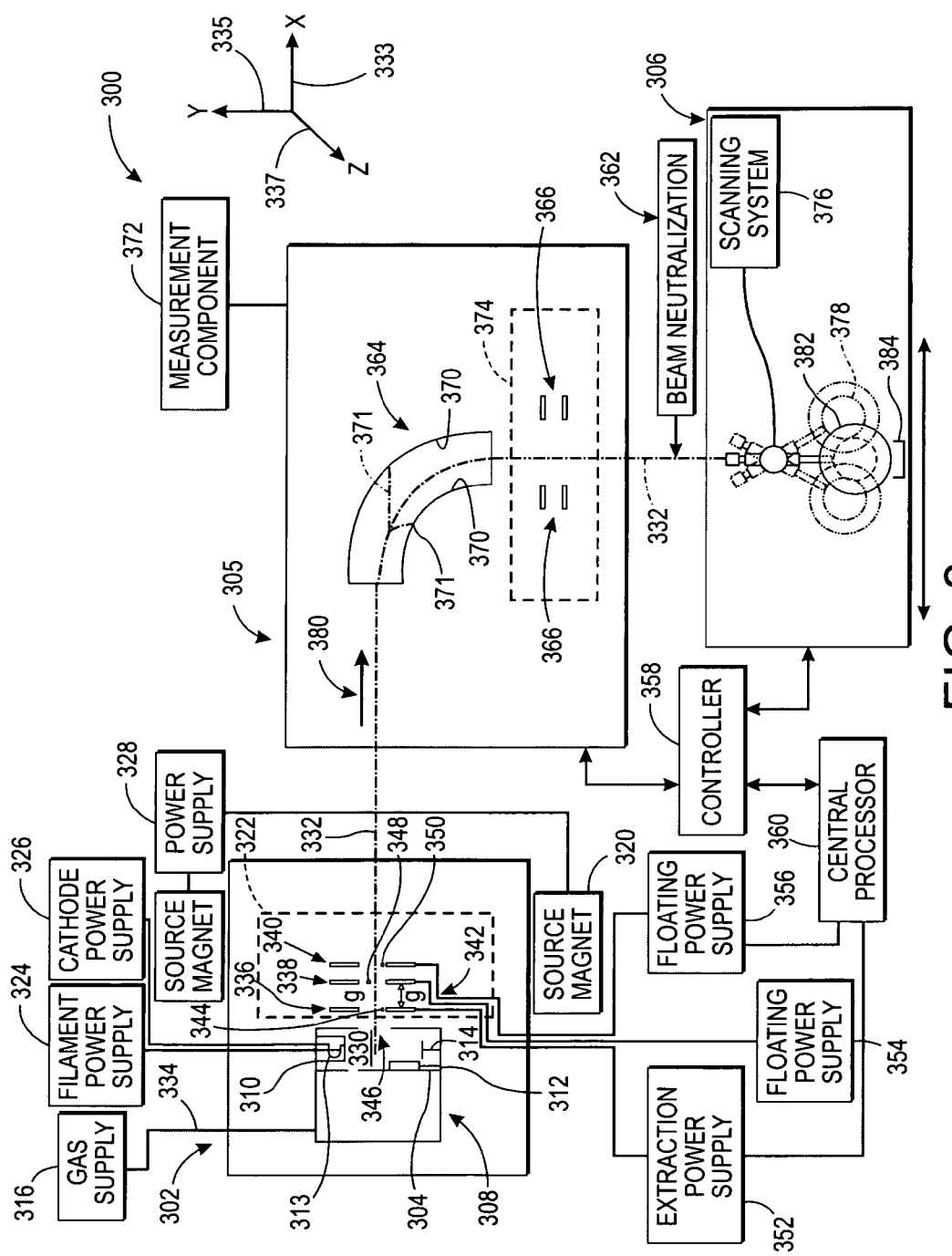
FIG. 3 is a simplified schematic block diagram of certain components of an exemplary high-dose ion implantation system wherein one or more aspects of the present invention are implemented.

Turning now to FIG. 3, the drawing illustrates, in a simplified schematic block diagram form, certain components of an exemplary high-dose ion implantation system 300 wherein one or more aspects of the present invention are implemented. The system 300 is illustrated for producing an ion beam 332 in the range of 0.5 to 60 keV, for example. The system 300 includes an ion source 302, a beamline assembly 305, and an end station 306. In the example shown, the ion source 302 comprises an plasma generating component 308, a cathode 310, a filament 313, an anode 312, a repeller 314, a gas supply 316, source magnet components 318 and 320, and an ion extraction electrode assembly 322. A dopant gas can, for example, be fed into the chamber 304 from a gas source 316 through a conduit 334. A filament power supply 324 and a cathode voltage supply 326 are operatively coupled to a filament 313 and the cathode 310 respectively; and another power supply 328 is connected to the source magnet components 318, 320 in the example shown.

In operation, the gas supply 316 provides one or more precursor gases (e.g., via the conduit 334) into an area 330 of the ion source 302 wherein the ions are generated. The cathode 310, in one example, includes the filament 313 (e.g., a rod made of tungsten or tungsten alloy) which can be heated by the filament power supply 324 (e.g., to about 2500 degrees Kelvin) to excite electrons therein to collide with dopant gas molecules. The cathode voltage supply 326 can, in turn, provide additional energy to the cathode 310 (e.g., to heat the cathode 310 to about 2500 degrees Kelvin) to cause electrons to jump from the cathode 310 into the area 330 wherein the gas is situated. The anode 312 assists with drawing the electrons into the area 330, and may include sidewalls of the ion source 302, for example. Further, a power supply (not shown) may also be coupled to the anode 312 so that a bias can be set up between the cathode 310 and the anode 312 to facilitate drawing additional electrons into the area 330, for example.

The repeller 314 can also assist with maintaining the electrons within the area 330. In particular, a bias imparted to the mirror electrode repeller 314 serves to repel electrons emitted from the cathode 310 back into the area 330. Similarly, a magnetic field induced within the ion source 302 by the source magnet 318 and 320 serve to maintain electrons within the area 330 and off of sidewalls of the source 302. In the example shown, two source magnet components 318 and 320 of the source magnet are shown. These may be indicative, of a cross-sectional view of windings and/or a yoke of an electromagnet, for example. The electrons moving around within the area 330 collide with the gaseous molecules within the area 330 to create the ions. In particular, electrons that collide with gaseous molecules with sufficient force cause one or more electrons to become dislodged from the molecules, thus producing positively charged gaseous ions. It will be appreciated that the magnetic field applied by the source magnet components 318 and 320 may be perpendicular to the cathode 310 in a y direction 335 to increase the electron path length and to assist with suspending plasma of both the ions and the electrons within the area 330.

It will be further appreciated that the present invention contemplates and has application that can utilize negatively charged ions, as well. Additionally, it will also be appreciated that the beam current density or intensity is related to the number of ions produced within the ion source 302. Thus, in accordance with one or more aspects of the present invention, any one or more of the components of the ion source 302 can be selectively adjusted to modulate the beam current. By way of example only and not limitation, the magnetic field set up by the source magnet components 318 and 320 can be altered by controlling the power supply 328 to increase or retard the number of ions generated within the source 302 to correspondingly increase or decrease the beam current.

It will be further appreciated that the present invention contemplates and has application to ion sources of types other than the arc discharge source described above. For example, an ion source may include a means of RF excitation to produce ions. Such a source is disclosed in U.S. Pat. No. 5,661,308, the entirety of which is hereby incorporated by reference. An additional example is an ion source that may include a means of excitation by electron beam injection to produce ions. This is sometimes referred to as a "soft ionization" type of source. An example of such a source is disclosed in U.S. Pat. No. 6,452,338, the entirety of which is also hereby incorporated by reference. An additional example of an ion source to which the present invention has application is an ion source that includes a means of microwave excitation to produce a plurality of ions.

The ion beam 332 (e.g., simply illustrated as a single dashed line) is extracted from the ion source 302 by an extraction electrode 336 which is generally biased negatively with respect to the ion source 302, thereby attracting positive ions. A suppression electrode 338 serves the function of providing suppression of electrons which are attracted toward the ion source 302 by its generally positive bias. Further on in a positive x direction 333, the beam 332 encounters a ground electrode 340. In one or more embodiments a gap 342 between the fixed extraction electrode 336 and the movable suppression electrode 338 and a ground electrode 340, can be adjusted.

In this embodiment the size of the gap (g) 342 can be increased for higher energy beams and decreased for lower energy beams, for example. Therefore, by adjusting the gap 342 between the extraction electrode 336 and the suppression electrode 338, the electric field can be adjusted to avoid and/or reduce arc discharges, thus allowing the ion implantation system 300 to be operated at higher beam currents than can typically be realized over a wider energy range (e.g., 0.5 to 80 keV). In contrast, at low beam energies, space charge repulsion can be reduced by decreasing the gap 342. In addition, the ability to adjust the gap 342 allows greater focus and control of the ion beam 332.

The extraction electrode 336 can comprise a single plate with an extraction aperture 344 formed therein, disposed opposite and in-line with an ion source exit aperture 346. The extraction electrode 336 is adjustably spaced from the suppression electrode 338 having a variable suppression aperture 348, by a distance referred to as the extraction gap (g) 342, as discussed supra. The suppression electrode 338 and the ground electrode 340 can each further comprise two or more separate plates (not shown), for adjusting the variable suppression and ground aperture, 348 and 350, respectively, also known by those of skill in the art as variable aperture electrode (VAE). The ground electrode 340 having the variable ground aperture 350 formed therein, is positioned on the other side of the suppression electrode 338, as illustrated, and can be fixedly spaced from the suppression electrode 338, for example.

Both the suppression electrode 338 and the ground electrode 340 can be adjustable so that the apertures 348 and 350 can be aligned to the extraction aperture 344 in the y-direction 335. In the alternative, the extraction aperture 344 and suppression aperture 348 can only be aligned during setup. However, it is to be appreciated by one skilled in the art that a mechanism can be utilized as an active control over all of the apertures in the y-axis direction 335.

The extraction electrode 336, the suppression electrode 338 and the ground electrode 340 are electrically insulated from each other and each is connected to a separate voltage sources 352, 354 and 356, respectively. Each of the voltage sources 352, 354 and 356 and a controller 358 are connected to a central processor 360 which generates control signals for controlling the potential on each of the electrodes 336, 338 and 340, an ion source arc chamber 304, and the gap 342. Thus, the measured ion energy can be used in a feedback loop to control parameters in ion generation, such as: the gap 342, aperture width/size adjustment, aperture alignment, the potential applied to the electrodes (336, 338 and 340), etc. The processor 360 can generate a control signal for controlling the ion beam extraction parameters depending on the measured energy, for example.

The ion beam 332 then enters the beamline assembly 305 and an associated analyzer magnet 364. The mass analysis magnet 364 can be formed at about a ninety degree angle and a magnetic field is generated therein. As the ion beam 332 enters the magnet 364, it is correspondingly bent by the magnetic field such that ions of an inappropriate charge-to-mass ratio are rejected. More particularly, ions having too great or too small of a charge-to-mass ratio are deflected 371 into side walls 370 of the magnet 364. In this manner, the magnet 364 only allows those ions to remain in the beam 332 which have the desired charge-to-mass ratio to completely traverse therethrough.

The control electronics or the controller 358 can adjust the strength and orientation of the magnetic field, among other properties. The magnetic field can, for example, be controlled by regulating the amount of electrical current running through field windings of the magnet 364. It will be appreciated that the controller 358 may include a programmable micro-controller, processor and/or other type of computing mechanism for overall control of the system 300 (e.g., by an operator, by previously and/or presently acquired data and/or programs).

The beamline assembly 305 may also include an accelerator/decelerator 374, for example, that comprises a plurality of electrodes 366 arranged and biased to accelerate and/or decelerate ions, as well as to focus, bend and/or decontaminate the ion beam 332. The electrodes 366 decontaminate the beam 332 by bending the beam 332 and separating out contaminating particles from the beam 332, in a manner discussed in further detail below.

Further, it will be appreciated that ion beam collisions with other particles degrade beam integrity, so that an entire beamline assembly 305, from the source 302 to the end station 306, may be evacuated by one or more pumps (not shown). Downstream of the accelerator/decelerator 374 is the end station 306 which receives the mass analyzed ion beam 332 from the beamline assembly 305. The end station 306 includes a scanning system 376 that may comprise a support or end effector 378 upon which a workpiece 382 is mounted for selective movement thereby. The end effector 378 and the workpiece 382 reside in a target plane that is generally perpendicular the xz plane) to the negative y direction of the ion beam 332.

It will be appreciated that the beam current may be affected by many of the components of the system 300. For example, respective biases on the extraction electrode 336, the suppression electrode(s) 338, the ground electrode(s) 340, and electrodes 366 can affect the beam current. Accordingly, the beam current can be modulated by selectively controlling one or more of the extraction and the suppression voltage supplies, 352 and 354, respectively. The floating ground supply 356, supply 328, supply 324 and supply 326 control the respective voltages applied to various components. It will be appreciated that while a combined set of the extraction electrode 336 and the suppression electrode 338 are discussed herein, the present invention contemplates separate sets of the extraction electrode 336 and suppression 338 electrodes having respective supplies that can be independently varied to alter the respective voltages applied to those electrodes. It will be further appreciated that the ground electrode 340 is generally modulated with a voltage different from the other electrodes 336 and 338, equal to or different from the ground potential.

The foregoing voltage supplies can be controlled by another controller, for example, that takes readings from a measurement system 372 (e.g., that includes a Faraday cup 384) indicative of the end of scan beam current utilized during ion implantation, for example. Similarly, the controller 358 can be operatively coupled to the beam neutralization system 362 to modulate the beam current by selectively regulating the amount of active plasma to which the ion beam 332 is subjected. Modulating the beam current via the source of plasma may be more effective at lower energies (e.g., less than about 3 keV) since active plasma neutralization is typically not required for efficient beam transport at higher energies. It will be appreciated that the controller 358 may also assist (e.g., the measurement system 368) in developing implantation waveforms as previously discussed, and may make use of such waveforms in facilitating selective adjustments to the ion beam current.

Figure 4:
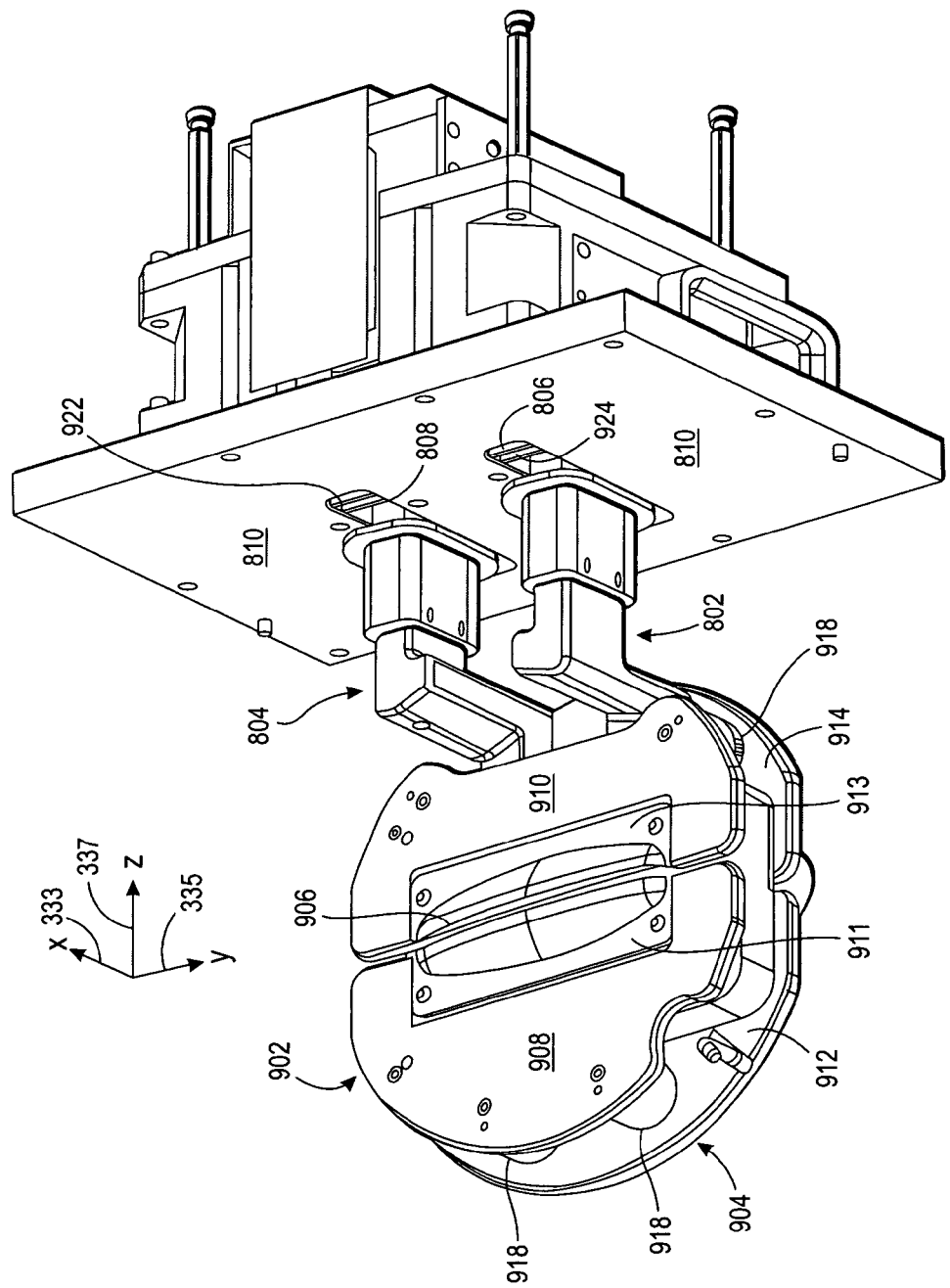
FIG. 4 is a perspective view of an electrode assembly in accordance with an aspect of the present invention.
Figure 5:
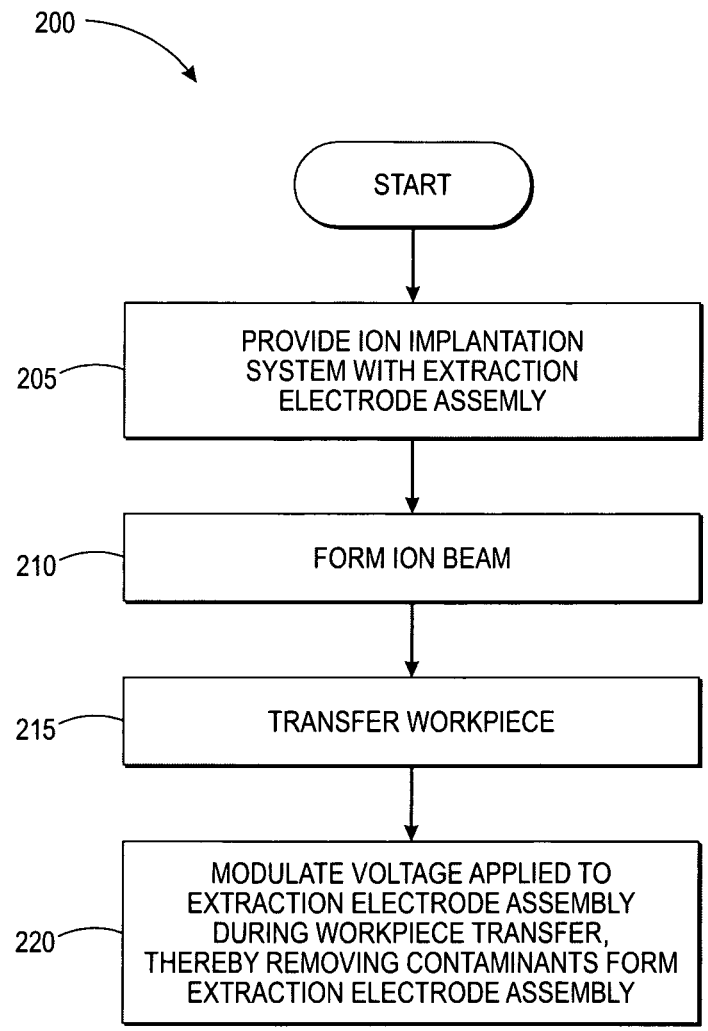
FIG. 5 is a cross-sectional view of an electrode assembly according to an exemplary aspect of the present invention.
Figure 6:
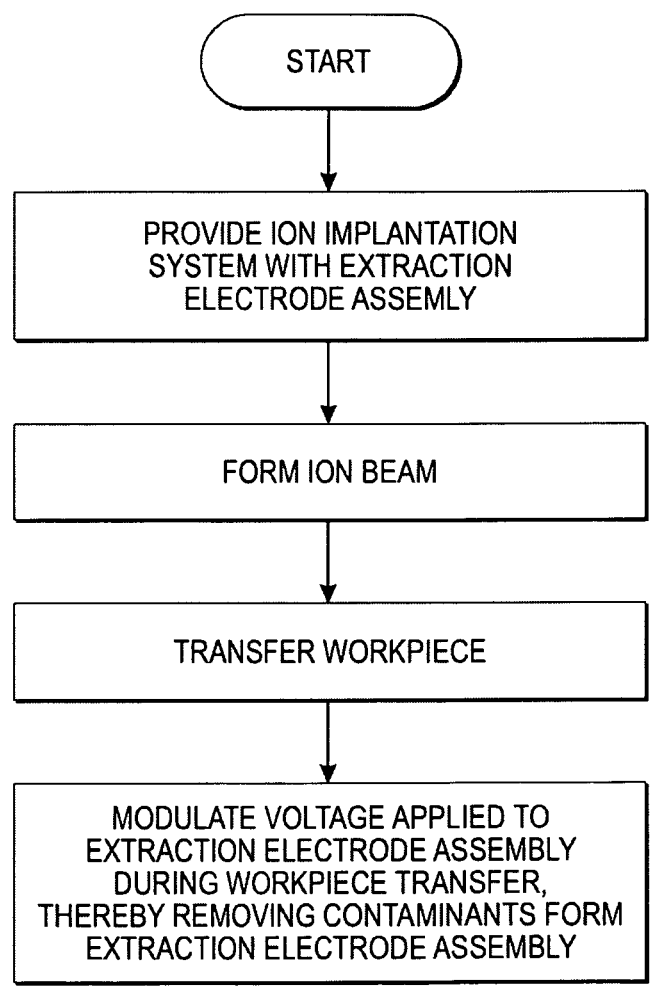
FIG. 6 is a block diagram of an exemplary method for reducing particle contamination according to another exemplary aspect of the invention.

Referring now to FIGS. 4 and 5, an extraction electrode plate assembly is illustrated in perspective view, according to one or more embodiments of the present invention. A similar variable gap electrode (VGE) is disclosed in commonly assigned U.S. Pat. No. 7,915,597, the entirety of which is hereby incorporated by reference. Referring to FIG. 4, an extraction electrode assembly 900 is comprised of two matching graphite disk assemblies 902 and 904, which make up the previously described suppression and ground electrodes, respectively. Each of the disk assemblies 902 and 904 are assembled and aligned in a shared plane that is perpendicular to the predetermined beam path x and each disk assembly is spaced apart to define an elongated gap 906 therebetween in which the ions exiting from the ion source 302 pass. The extraction electrode assembly can be precisely aligned with the predetermined ion beam path x.

The suppression disk assembly 902 is comprised of suppression electrode plate disk halves 908 and 910, and suppression plate replaceable edge insert pieces 911 and 913. Similarly, the ground disk half assembly 904 comprises plate disk halves 912 and 914, and ground plate disk half replaceable edge insert pieces (not shown). The disk half replaceable edge insert pieces are secured to their respective disk halves 908, 910, 912 and 914 and together define the electrode gap 906. The insert pieces, are replaceable due to potential damage caused by the impact of accelerating ions, thereby reducing the cost of replacing components. In addition, the disk halves, 908, 910, 912 and 914 can be replaced as necessary.

The suppression electrode plate disk half 908 can be secured in a spaced apart relationship to the ground electrode plate disk half 912 using, for example, spring-loaded shoulder screws in conjunction with ceramic spacers or suppression insulators 918 situated in between disk half 908 and 912 to provide the spaced apart, parallel relationship therebetween while also providing electrical insulation therebetween. Similarly, the suppression electrode plate disk half 910 is secured in a parallel, spaced apart relationship to the ground electrode plate disk half 914 with ceramic spacers or suppression insulators 918.

The assembly made up of plate disk halves 908 and 912 can be connected and supported by the support leg assembly 802. The connection is through screws connecting assembly 802 to 912, for example. Similarly assembly 910 and 914 can be supported by the leg 804, and the leg 804 is connected to the ground electrode plate disk half 914. The movement of the two support leg assemblies 802 and 804 will move the assembly made up of plate disk halves 908 and 912 and the assembly 910 and 914. Thus, the gap 906 and the aperture can be adjusted. The support leg assemblies 802 and 804 extend through slotted openings 806 and 808 in the support flange mounting plate 810. The spacing between the support leg assemblies 802 and 804 and the openings are covered by flexible ribbon bellows 922 and 924.

As illustrated in FIG. 5, the method 200 of the present invention begins with providing an ion implantation system in act 205, wherein the ion implantation system is configured to implant ions into the one or more workpieces via an ion beam, such as via the ion implantation system of FIG. 1. Although the ion implantation system of FIG. 1 is illustrated as one example, various other ion implantation systems having similar or dissimilar components can be provided for the implantation of the presently described method, and all such ion implantation systems are contemplated as falling within the scope of the present invention. The ion implantation system provided in act 205, for example, comprises, as a minimum: an ion source; an extraction electrode apparatus associated with the ion source; an end station configured to support a workpiece during an implantation of ions; and a control system for controlling voltage potentials and timing of voltage potentials applied to the extraction electrode apparatus.

In accordance with one example, an ion beam is formed in act 210 via the ion source. A suppression voltage is further applied to the suppression plate wherein electrons are selectively stripped from the ion extracted from the ion source to form a generally focused ion beam. A workpiece positioned downstream of the ion source and extraction electrode assembly, for example, is thus implanted with ions from the ion beam formed thereby. Once sufficient implantation is complete, the workpiece is transferred from the end station and an external environment in act 215, and another workpiece can be transferred from the external environment into the end station for ion implantation thereto.

In accordance with the invention, generally concurrent with the transferring of the workpiece into or out of the end station of act 215, the voltages applied to the ion source and the suppression electrode are modulated in act 220. In a preferred embodiment, high voltage switches associated with the extraction electrode of the ion source and the suppression electrode of the extraction electrode assembly are opened to allow the extraction electrode and the suppression electrode to realize a floating potential drifting to ground. This initial step is timed to occur in accordance with the end of an implantation cycle when a wafer is being transferred off of the wafer support in the end station, and has the effect of eliminating the extraction of ion from the ion source. Thereafter, a voltage applied to the cathode of the ion source, such as via filament power supply 324 and a cathode voltage supply 326, which are operatively coupled to a filament 313 and the cathode 310 respectively, is removed, by, for example setting the arc-current/cathode voltage control logic in an open loop to eliminate the formation of plasma in the ion source confinement chamber. Accordingly, in the present example, it is advantageous that the ion beam is extinguished during the workpiece transfer. Thereafter, and preferably after an induced delay of at least 50 ms, the high voltage switch coupled to the suppression electrode is closed to apply a high voltage on the order of about −15 KV to the suppression electrode, which induces a current flow for a defined period of time (preferably on the order of 0.2 sec) through the insulator separating the suppression electrode and the ground electrode, or an arc discharge thereacross. It has been found that this induced current flow and/or arc discharge removes deposits in and around the vicinity of the electrodes, which precipitate away from the extraction electrode assembly, thereby mitigating contamination along the ion beamline and on the wafer in the ion implantation system.

It will be appreciated that the foregoing steps that makeup act 220 are typically carried out in a controller and/or computer via software and/or firmware, such as by controller 358 and central processor 360, as described herein. These process steps can be repeated for as much time as may be allotted during transfer of a treated wafer out of the endstation to placement of an untreated wafer on the workpiece support for implantation. The modulation of the suppression electrode voltage, as provided by the present invention, is cycled one or more cycles during the transferring of workpieces. Thus, act 220 advantageously occurs concurrently and possibly repetitively within a period of time when the workpiece is transferred between the end station and an external environment (e.g., during an exchange of workpieces in act 215), thereby mitigating a potential for workpiece contamination due to particles released by the voltage modulation of the present invention from being transported to the workpiece via the ion beam.

By modulating the suppression electrode voltage in act 220, material previously deposited (e.g., sputtered) onto one or more surfaces associated with the extraction electrode assembly is generally released from the surface, as will be described further, without contaminating the workpiece. The present invention mitigates the potential for the previously deposited materials to deleteriously impact the workpiece during a subsequent ion implantation.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. From the above description of a preferred embodiment of the invention, those skilled in the art will perceive improvements, changes and modifications. Such improvements, changes and modifications within the skill of the art are intended to be covered by the appended claims.

The invention claimed is:

1. A method for reducing particle contamination in an ion implantation system, the method comprising the steps of:
   providing an ion implantation system comprising:
      an ion source;
      an extraction electrode assembly situated proximate to the ion source, said extraction electrode assembly including a suppression electrode and a ground electrode separated by ceramic insulators for electrically isolating the suppression electrode and the ground electrode; and
      an end station configured to transfer workpieces into and out of the end station for selective implantation of ions into the workpieces;
   forming an ion beam via the ion source operating in conjunction with the with the extraction electrode assembly proximate to the ion source, whereby a cathode voltage is applied to the ion source for generating ions therein, and a suppression voltage is applied to the extraction electrode assembly proximate to the ion source for preventing electrons in the ion beam from being drawn into the ion source;
   exchanging the workpieces between the end station and an external environment such that, once sufficient implantation of ions is complete, a treated workpiece is transferred from the end station into an external environment, and an untreated workpiece is transferred from the external environment into the end station for implantation of ions; and
   modulating the suppression voltage applied to the extraction electrode assembly proximate to the ion source generally concurrent with the exchanging step whereby treated workpieces are transferred from the end station into an external environment, and the untreated workpieces are transferred from the external environment into the end station for implantation of ions, thereby inducing a current flow through the ceramic insulators of the extraction electrode assembly during the exchange step to remove deposits on surfaces of the extraction electrode assembly and to mitigate subsequent contamination of workpieces.

2. The method of claim 1, wherein modulating the suppression voltage applied to the extraction electrode assembly proximate to the on source comprises cyclically varying the suppression voltage for one or more cycles.

3. The method of claim 1, wherein the previously deposited material precipitates away from the extraction electrode assembly proximate the on source.

4. An improvement to an on implantation system for reducing particle contamination therein, the on implantation system comprising:
   an on source;
   an extraction electrode assembly situated proximate to the on source for extracting ions therefrom, said extraction electrode assembly including a suppression electrode and a ground electrode separated by ceramic insulators for electrically isolating the suppression electrode and the ground electrode; and an end station configured to exchange the workpieces between the end station and an external environment such that, once sufficient implantation of ions is complete, a treated workpiece is transferred from the end station into an external environment, and an untreated workpiece is transferred from the external environment into the end station for selective implantation of ions into the workpieces;

said improvement comprising a controller configured to selectively modulate a voltage applied to the extraction electrode assembly proximate the on source generally concurrent with the exchange of the workpieces, thereby inducing a current flow through the ceramic insulators of the extraction electrode assembly during the exchange of workpieces to remove deposits on surfaces of the extraction electrode assembly and to mitigate subsequent contamination thereof.

5. The improvement of claim 4, wherein the controller is further configured to selectively modulate a voltage applied to the ion source to eliminate formation of ion therein.

* * * * *